United States Patent [19]

Davey et al.

[11] 4,002,880
[45] Jan. 11, 1977

[54] EVAPORATION SOURCE

[75] Inventors: Ernest A. Davey, Peabody, Mass.;
Norman A. Mathieu, Exeter, N.H.;
Edward D. Parent, Hamilton, Mass.

[73] Assignee: GTE Sylvania Incorporated,
Danvers, Mass.

[22] Filed: Aug. 13, 1975

[21] Appl. No.: 604,507

[52] U.S. Cl. .................................. 219/275; 21/119
[51] Int. Cl.² .......................................... A61L 3/00
[58] Field of Search .......... 219/271, 272, 273, 275;
118/48, 49, 49.1, 49.5; 21/110, 117, 119

[56] References Cited

UNITED STATES PATENTS

| | | | |
|---|---|---|---|
| 2,435,997 | 2/1948 | Bennett | 118/49 |
| 2,975,075 | 3/1961 | Beese | 118/49 X |
| 3,244,857 | 4/1966 | Bertelsen et al. | 118/49.1 |
| 3,872,280 | 3/1975 | Van Dalen | 219/275 X |

*Primary Examiner*—C. L. Albritton
*Attorney, Agent, or Firm*—James Theodosopoulos

[57] ABSTRACT

In an evaporation source for the vacuum deposition of sublimating material, the evaporant surrounds, and is spaced from, an axially disposed coiled tungsten heater. The evaporated material passes out of the source in an upward direction to deposit on a substrate located above the source.

2 Claims, 1 Drawing Figure

U.S. Patent  Jan. 11, 1977  4,002,880
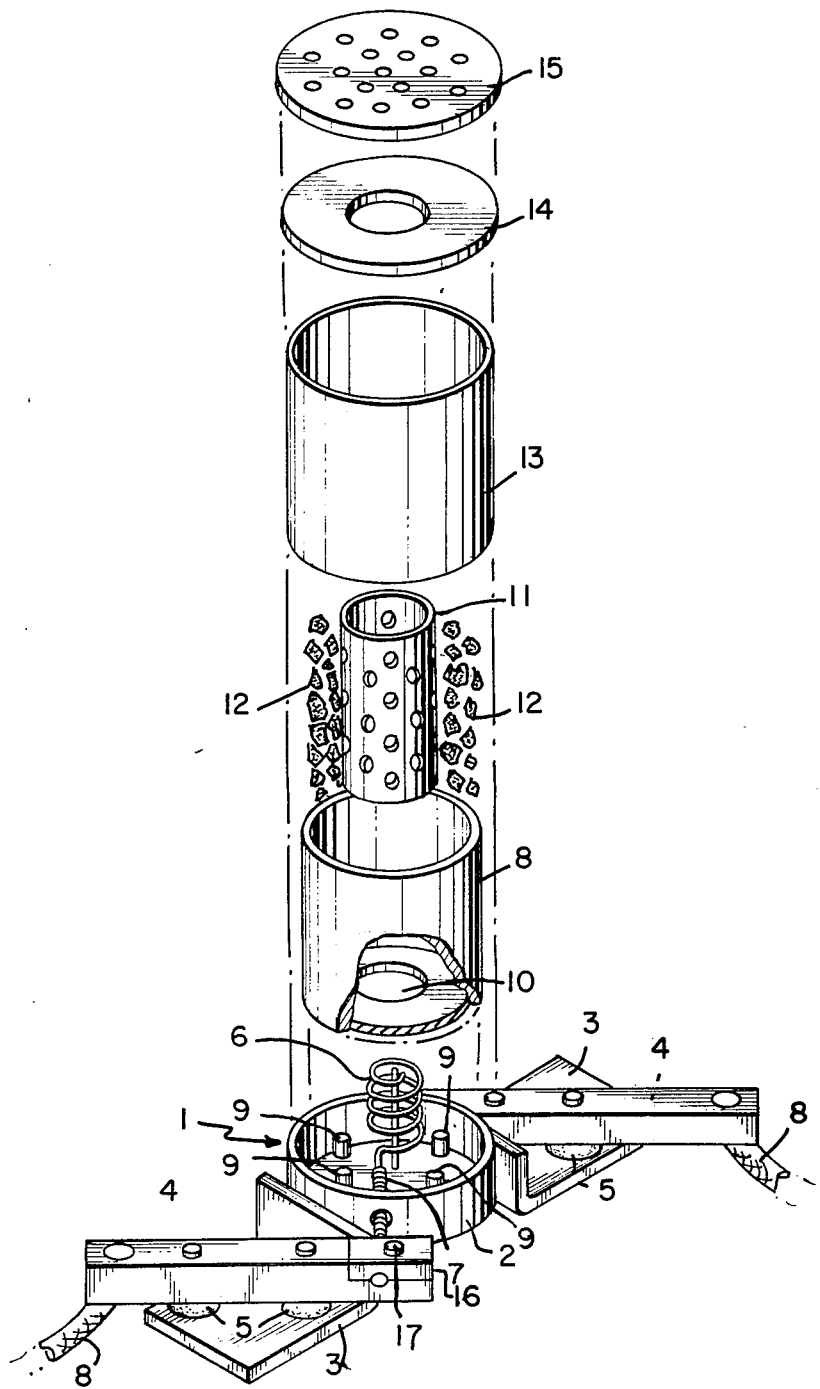

EVAPORATION SOURCE

THE INVENTION

This invention concerns an evaporation source, for the vacuum deposition of sublimating material, having a readily replaceable heater and in which the sublimating material may be in loose granular form or a pressed powder compact.

The single FIGURE in the drawing is an exploded perspective view of one embodiment of an evaporation source in accordance with this invention.

The source comprises a furnace base assembly 1 in which a cylindrical metal cup holder 2 is attached to two opposing metal L-shaped base brackets 3. As shown in the drawing, diametrically opposite sections of cup holder 2 are welded to the upright legs of brackets 3. Bus bars 4 are insulatively connected to brackets 3 by means of standoff ceramic insulators 5.

The heater for the evaporation source is an upright helically coiled tungsten wire heater 6 made of sufficiently thick wire, for example, three strands of 30 mil wire, to be self-supporting when held by its legs. The upper leg extends axially downward within the coiled body of the heater and the legs extend opposite one another, orthogonal to the axis of the heater, through clearance holes in cup holder 2. Each leg is connected to respective bus bar 4 by means of a metal block 16 that is held against bus bar 4 by a machine screw 17. The leg is seated in a V groove in bus bar 4 and securely clamped between bus bar 4 and metal block 16 by tightening screw 17. In order to avoid unnecessary heating of the heater legs, each leg has an overwind tungsten coil 7 thereon which appreciably reduces the electrical resistance of the leg. Electrical power can be brought to heater 6 from an outside power source by means of lead-in wires 8 which are connected to bus bars 4. Heater 6 can be easily replaced, when necessary, by merely loosening screws 17 and sliding each leg through its respective clearance hole in cup holder 2.

Disposed within cup holder 2 and surrounding heater 6 is a refractory metal cup 8. Cup 8 rests on four rods 9 which are fastened in cup holder 2 and which support the bottom of cup 8 just above the horizontal portions of the heater legs. Cup 8 has a hole 10 in its bottom through which heater 6 extends when cup 8 is resting on rods 9.

Concentrically disposed within cup 8 is a cylindrical screen 11 made of refractory metal, e.g., molybdenum. The diameter of screen 11 is slightly smaller than the diameter of hole 10 so that screen 11 fits within hole 10 and is supported there by three tabs (not shown), 120° apart and about ⅛ inch square cut into the lower peripheral edge of screen 11 and folded horizontally back, which rest on the inside lower surface of cup 8.

The sublimating material to be evaporated is contained in the space between cup 8 and screen 11. The drawing shows small chunks 12 of granular material, for example, silicon monoxide, in said space.

Disposed around cup 8 is a cylindrical heat shield 13 to reduce heat loss. Shield 13 rests on the upper edge of cup holder 2.

The drawing shows two covers, 14 and 15, either of which can be used. Cover 14 has one hole, at its center, about the same diameter as that of screen 11. The evaporated material emerges through this hole upwards and deposits on a substrate located above the evaporation source. Cover 15 has a plurality of small holes and is used for more diffuse deposition.

In operation, the material to be evaporated, for example, chunks 12, is heated by radiant heat from heater 6 passing through screen 11. The evaporated material passes upward and out through the chimney hole in cover 14 or through the several holes in cover 15. In one example, chunks 12 were silicon monoxide, 3/8 inch to 10 mesh in size, and power was applied to the 3 × 0.040 inch strand tungsten heater 6 at 12 volts, 100 amperes which produced a SiO deposit on a monitor crystal 30 inches from the source 500 angstroms thick in one minute.

An example of operation of the apparatus with powdered sublimating material was as follows. A solid cylinder having the same diameter as screen 11 was placed in cup 8 and the annular space therebetween was filled with powdered zinc sulfide. Cup 8 was then placed in a press and the powder was pressed, with a suitably shaped plunger, with sufficient pressure to form a free standing compact. After removal of the solid cylinder, the evaporant loaded cup 8 was then replaced in the evaporating assembly with screen 11 being omitted. At a vacuum of $2 \times 10^{-4}$ torr and upon application of 12 volts, 50 amperes to the 3 × 0.030 inch strand tungsten heater 6, a 600 angstrom thick deposit of zinc sulfide was obtained on a substrate 30 inches from the source in one minute.

We claim:

1. An evaporation source for the vacuum deposition of sublimating material comprising: a furnace base assembly including two bus bars and a cup holder; an upright coiled tungsten wire heater disposed in said cup holder and having two legs, each leg horizontally extending through a clearance hole in said cup holder and being connected to a bus bar; a cylindrical cup supported on said assembly slightly above the horizontally extending portions of the heater legs and surrounding said heater; and sublimating material disposed in said cup surrounding, and spaced from, said heater.

2. The evaporation source of claim 1 comprising, in addition, a cylindrical screen disposed within said cup, spaced therefrom, and surrounding said heater, wherein said sublimating material is disposed in the annular space between said screen and said cup.

* * * * *